(12) United States Patent
Yang

(10) Patent No.: US 9,171,813 B2
(45) Date of Patent: Oct. 27, 2015

(54) SUBSTRATE INCLUDING A DAM FOR SEMICONDUCTOR PACKAGE, SEMICONDUCTOR PACKAGE USING THE SAME, AND MANUFACTURING METHOD THEREOF

(71) Applicant: SK hynix Inc., Icheon-si Gyeonggi-do (KR)

(72) Inventor: Seung Taek Yang, Seoul (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 13/827,289

(22) Filed: Mar. 14, 2013

(65) Prior Publication Data

US 2014/0183724 A1    Jul. 3, 2014

(30) Foreign Application Priority Data

Dec. 28, 2012  (KR) .................. 10-2012-0155679

(51) Int. Cl.
*H01L 23/48*     (2006.01)
*H01L 23/52*     (2006.01)
*H01L 29/40*     (2006.01)
*H01L 23/00*     (2006.01)
*H01L 23/24*     (2006.01)
*H01L 21/56*     (2006.01)

(52) U.S. Cl.
CPC .............. *H01L 24/10* (2013.01); *H01L 21/563* (2013.01); *H01L 23/24* (2013.01); *H01L 24/81* (2013.01); *H01L 24/83* (2013.01); *H01L 24/13* (2013.01); *H01L 24/16* (2013.01); *H01L 24/29* (2013.01); *H01L 24/32* (2013.01); *H01L 2224/16146* (2013.01); *H01L 2224/16227* (2013.01); *H01L 2224/17181* (2013.01); *H01L 2224/26175* (2013.01); *H01L 2224/2919* (2013.01); *H01L 2224/32225* (2013.01); *H01L 2224/73204* (2013.01); *H01L 2224/8114* (2013.01); *H01L 2224/81191* (2013.01); *H01L 2224/81815* (2013.01); *H01L 2224/8314* (2013.01); *H01L 2224/83192* (2013.01); *H01L 2224/83862* (2013.01); *H01L 2224/9211* (2013.01)

(58) Field of Classification Search
CPC ................. H01L 2224/16; H01L 2924/01079; H01L 2924/01029; H01L 21/563; H01L 24/81; H01L 2924/14; H01L 2924/18161; H01L 2924/15311; H01L 2224/73204
USPC .................. 257/737, 778, 782, 783, 786, 773
See application file for complete search history.

(56) References Cited

U.S. PATENT DOCUMENTS 7,291,924 B2 *  11/2007  Wang et al. .................... 257/777
8,294,283 B2 *  10/2012  Ihara ............................. 257/778
2013/0259421 A1 *  10/2013  Yamakami et al. ............. 385/14

FOREIGN PATENT DOCUMENTS

KR        19970067797 A    10/1997

OTHER PUBLICATIONS

Massimo Mastrangeli et al., Challenges for Capillary Self-Assembly of Microsystems, IEEE Transactions on Components, Packaging, and Manufacturing Technology, Jan. 2011, p. 133-149, vol. 1, Issue 1.

*Primary Examiner* — A. Sefer
*Assistant Examiner* — Dilinh Nguyen
(74) *Attorney, Agent, or Firm* — William Park & Associates Ltd.

(57) ABSTRACT

A substrate for a semiconductor package includes a substrate body having a first surface and a second surface which faces away from the first surface, and formed with at least one bump land on the first surface, and a dam formed and projected over an edge of the first surface of the substrate body, and having an underfill member discharge unit.

18 Claims, 5 Drawing Sheets

SUBSTRATE INCLUDING A DAM FOR SEMICONDUCTOR PACKAGE, SEMICONDUCTOR PACKAGE USING THE SAME, AND MANUFACTURING METHOD THEREOF

CROSS-REFERENCE TO RELATED APPLICATIONS

The present application claims priority to Korean Patent Application Number 10-2012-0155679 filed in the Korean Intellectual Property Office on Dec. 28, 2012, which is incorporated herein by reference in its entirety.

BACKGROUND

1. Field of Invention

The present invention relates generally to a semiconductor package, and more particularly, to a substrate for a semiconductor package, a semiconductor package using the same, and a manufacturing method thereof.

2. Description of the Related Art

As electronic devices are becoming more compact with more capabilities, a packaging technology for mounting a semiconductor apparatus is also required for high speed, high performance, and high density mounting. In order to meet such requirements, a flip chip mounting technology for mounting a chip in the type of a chip scale package has been suggested.

The flip chip mounting technology comprises of not packaging a semiconductor chip and rather mounting the semiconductor chip itself onto a substrate. The substrate and the semiconductor chip are soldered to each other by bumps which are correspondingly disposed over connection pads formed on the substrate.

In order to prevent a solder joint crack which is likely to occur due to an external shock or a difference in coefficient of thermal expansion, an underfill layer may be formed by introducing an underfill member of a liquid phase between the semiconductor chip and the substrate and then setting the introduced underfill member.

In this regard, in the conventional art, when bonding a semiconductor chip formed with bumps onto a substrate by applying an NCP (non-conductive paste) or an NCF (non-conductive film), 1 to 2 minutes are required to complete a process of aligning the semiconductor chip on the substrate, performing die bonding, and then applying heat and pressure. Thus, in order to bond a plurality of semiconductor chips, a corresponding lengthy period is required. In particular, when bonding a semiconductor chip which adopts TSVs (through-silicon vias), additional time is required.

SUMMARY

Embodiments of the present invention are directed to a substrate for a semiconductor package capable of allowing a semiconductor chip to be quickly bonded to a substrate, a semiconductor package using the same, and a manufacturing method thereof.

In an embodiment of the present invention, a substrate for a semiconductor package includes: a substrate body having a first surface and a second surface which faces away from the first surface, and formed with at least one bump land on the first surface; and a dam formed and projected over an edge of the first surface of the substrate body, and having an underfill member discharge unit.

The dam may include a plurality of dams, and the underfill member discharge unit may include a plurality of gaps each of which is defined between two adjacent dams or a slit which is defined between two adjacent dams. The underfill member discharge unit may include a discharge hole which is defined to penetrate a portion of the dam.

In another embodiment of the present invention, a semiconductor package includes: a substrate including a substrate body having a first surface and a second surface which faces away from the first surface, and formed with at least one bump land on the first surface; a dam formed and projected over an edge of the first surface of the substrate body, and having an underfill member discharge unit; and a first semiconductor chip having a third surface which faces the first surface and a fourth surface which faces away from the third surface, formed with a bump corresponding to a bump land on the third surface, and bonded to the substrate.

The dam may include a plurality of dams, and the underfill member discharge unit may include a plurality of gaps each of which is defined between two adjacent dams or a slit which is defined between two adjacent dams. The underfill member discharge unit may include a discharge hole which is defined to penetrate a portion of the dam. The dam may have a height that is less than a height of the fourth surface and greater than a vertical space between the third surface and the second surface. An inside space surrounded by the dam may have a size greater than or equal to that of the first semiconductor chip. An underfill member may be interposed between the substrate and the first semiconductor chip and may include an NCF (non-conductive film) or an NCP (non-conductive paste).

The first semiconductor chip may include through electrodes which pass through the third surface and the fourth surface.

The semiconductor package may further include a second semiconductor chip having a fifth surface which faces the fourth surface and a sixth surface which faces away from the fifth surface, bonded to the fourth surface, and formed with bumps corresponding to the through electrodes.

In another embodiment of the present invention, a method for manufacturing a semiconductor package includes: preparing a substrate that includes a substrate body which has a first surface and a second surface facing away from the first surface and formed with at least one bump land on the first surface, and a dam which is formed and projected onto an edge of the first surface of the substrate body and has an underfill member discharge unit; introducing an underfill member over an inside space surrounded by the dam of the first surface of the substrate body; disposing a semiconductor chip which has a third surface with bumps and a fourth surface facing away from the third surface, in a flip-chip type manner over the substrate over which the underfill member is introduced; and connecting the bumps of the semiconductor chip with the bump lands, wherein, in connecting the bumps of the semiconductor chip with the bump lands, the underfill member is discharged through the underfill member discharge unit.

The dam may include a plurality of dams, and the underfill member discharge unit may include a plurality of gaps each of which is defined between two adjacent dams or a slit which is defined between two adjacent dams. The underfill member discharge unit may include a discharge hole which is defined to penetrate a portion of the dam. In the forming of the dam, the dam may be formed to be less than a height of the fourth surface and greater than a vertical space between the third surface and the second surface.

In another embodiment of the present invention, a semiconductor package may include: a substrate including a substrate body which has a first surface and a second surface facing away from the first surface, formed with at least one bump land on the first surface, and defined with a discharge opening penetrating the first surface and the second surface; a dam which is formed and projected over an edge of the first surface of the substrate body; and a semiconductor chip having a third surface which faces the first surface and a fourth surface which faces away from the third surface, formed with bumps corresponding to bump lands on the third surface, and bonded to the substrate.

The dam may have a height that is less than a height of the fourth surface and greater than a vertical space between the third surface and the substrate. An underfill member may be interposed between the substrate and the semiconductor chip. An inside space surrounded by the dams may have a size greater than or equal to that of the semiconductor chip.

In another embodiment of the present invention, a electronic system may include: a controller; an input/output unit; a memory; and a bus coupling the controller, the input/output unit, and the memory, in order to provide a path through which data move, wherein the controller and the memory each may include a semiconductor package that includes: a substrate including a substrate body having a first surface and a second surface which faces away from the first surface, and formed with at least one bump land on the first surface, and a dam formed and projected over an edge of the first surface of the substrate body, and having an underfill member discharge unit; and a first semiconductor chip having a third surface which faces the first surface and a fourth surface which faces away from the third surface, formed with a bump corresponding to the bump land, on the third surface, and bonded to the substrate.

DETAILED DESCRIPTION

Hereafter, specific embodiments of the present invention will be described in detail with reference to the accompanying drawings.

It is to be understood herein that the drawings are not necessarily to scale and in some instances proportions may have been exaggerated in order to more clearly depict certain features of the invention.

Figure 1:
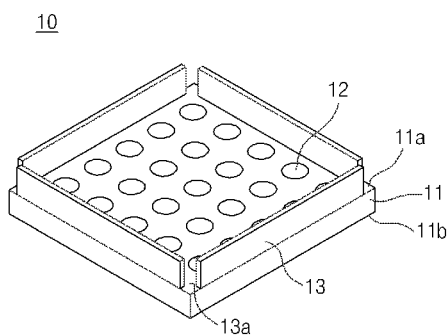
FIG. 1 is a perspective view illustrating a substrate for a semiconductor package in accordance with an embodiment of the present invention.

Referring to FIG. 1, a semiconductor substrate 10 according to an embodiment of the present invention may include a substrate body 11 and dams 13.

The substrate body 11 may have a first surface 11a and a second surface 11b which faces away from the first surface 11a. One or more bump lands 12 may be formed on the first surface 11a to be connected with bumps of a semiconductor chip which are to be mounted onto the first surface 11a.

The dams 13 may be formed on the edges of the first surface 11a of the substrate body 11 in such a way as to project upward. A pair of dams 13 may be disposed in each of a transverse direction and a longitudinal direction in such a way as to face each other, on the substrate body 11 which may have a rectangular shape. A gap 13a may be defined between each adjacent pair of dams 13 in the transverse direction and the longitudinal direction. Each gap 13a may effectively define exposed corners of the substrate body 11. Gaps 13a may serve as discharge units through which an underfill member introduced when bonding the semiconductor chip to the substrate 10 (described later) is discharged, thereby preventing overflow of the underfill member.

Figure 2:
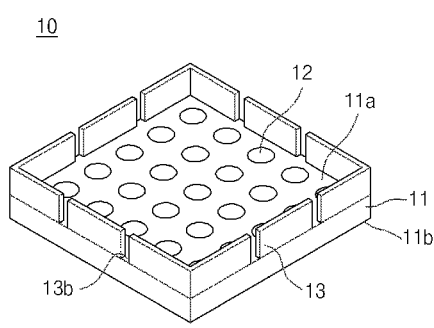
FIG. 2 is a perspective view illustrating a substrate for a semiconductor package in accordance with another embodiment of the present invention.

Referring to FIG. 2, a semiconductor substrate 10 according to an embodiment of the present invention may include a substrate body 11 and dams 13.

The substrate body 11 may have a first surface 11a and a second surface 11b which faces away from the first surface 11a. One or more bump lands 12 may be formed on the first surface 11a to be connected with bumps of a semiconductor chip which are to be mounted onto the first surface 11a.

A plurality of dams 13 may be formed on the edges of the first surface 11a of the substrate body 11 in such a way as to project upward. A slit 13b to discharge an underfill member may be defined between two adjacent dams 13. The slits 13b may effectively be defined on the sides of the substrate body 11 which may have a rectangular shape. The slits 13b may prevent overflow of the underfill member introduced when bonding the semiconductor chip to the substrate 10, as will be further described later.

Figure 3:
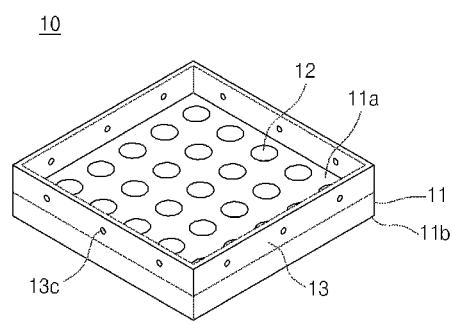
FIG. 3 is a perspective view illustrating a substrate for a semiconductor package in accordance with another embodiment of the present invention.

Referring to FIG. 3, a semiconductor substrate 10 according to an embodiment of the present invention may include a substrate body 11 and dams 13.

The substrate body 11 may have a first surface 11a and a second surface 11b which faces away from the first surface 11a. One or more bump lands 12 may be formed on the first surface 11a to be connected with bumps of a semiconductor chip which are to be mounted onto the first surface 11a.

The dams 13 may be formed on the edges of the first surface 11a of the substrate body 11 in such a way as to project upward. A pair of dams 13 may be disposed in each of a transverse direction and a longitudinal direction in such a way as to face each other, on the substrate body 11 which may have a rectangular shape. One or more discharge holes 13c may be defined in each dam 13. Discharge holes 13c may prevent overflow of the underfill member introduced when bonding the semiconductor chip to the substrate 10, as will be further described later.

Figure 4:
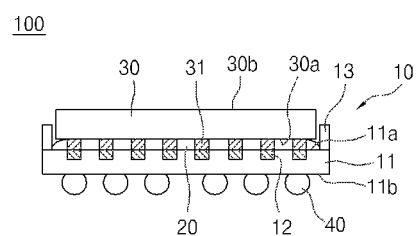
FIG. 4 is a cross-sectional view illustrating a semiconductor package in accordance with another embodiment of the present invention.

Referring to FIG. 4, a semiconductor package 100 according to an embodiment of the present invention may include a substrate 10, a semiconductor chip 30, and an underfill member 20.

The substrate 10 may include a substrate body 11 and dams 13.

The substrate body 11 may have a first surface 11a and a second surface 11b which faces away from the first surface 11a. A plurality of bump lands 12 may be formed on the first surface 11a to be connected with bumps 31 of the semiconductor chip 30 which are to be mounted onto the first surface 11a.

The dams 13 may be formed on the edges of the first surface 11a of the substrate body 11 in such a way as to project upward. At least one dam 13 may be disposed in each of a transverse direction and a longitudinal direction on the substrate body 11 which may have a rectangular shape. In order to prevent overflow of the underfill member 20 introduced when bonding the semiconductor chip 30 to the substrate 10, a gap (see the reference numeral 13a of FIG. 1) may be defined between adjacent dams 13 in the transverse direction and the longitudinal direction. Each gap 13a may effectively define exposed corners of the substrate body 11. As for alternatives to the discharge units of the underfill member 20, slits (see the reference numeral 13b of FIG. 2) or discharge holes (see the reference numeral 13c of FIG. 3) may be defined instead of gaps 13a.

The semiconductor chip 30 may have a third surface 30a which faces the first surface 11a of the substrate body 11 and a fourth surface 30b which faces away from the third surface 30a, and may include therein memories, logic components, passive devices, etc. One or more bonding pads (not shown) may be formed on the third surface 30a to electrically connect the semiconductor chip 30 with the substrate 10, and the bumps 31 may be formed on the respective bonding pads.

In order to align the semiconductor chip 30 to the substrate 10 in a flip-chip manner, the dams 13 may have a height that is less than the height of the fourth surface 30b and greater than the vertical space between the third surface 30a and the substrate 10.

The underfill member 20 may fill the space between the substrate 10 and the semiconductor chip 30. The underfill member 20 may comprise of an NCF (non-conductive film) or an NCP (non-conductive paste) with a predetermined viscosity.

Figure 5:
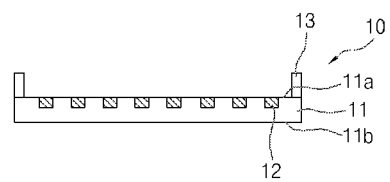
FIGS. 5 to 8 are cross-sectional views sequentially illustrating processes for manufacturing the semiconductor package of FIG. 4.

Referring to FIG. 5, a substrate 10 formed with a plurality of bump lands 12 may be prepared, and dams 13 may be formed to project upward from the edges of the substrate 10. The dams 13 may be disposed such that the dams 13 are separated, thereby leaving room for and defining gaps (see the reference numeral 13a of FIG. 1) on the corners of the substrate 10.

Figure 6:
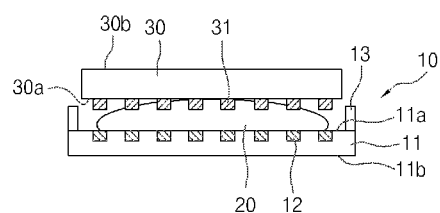

Referring to FIG. 6, an underfill member 20 comprising of an NCF (non-conductive film) or an NCP (non-conductive paste) may be introduced onto the substrate 10, and a semiconductor chip 30 may subsequently be mounted onto the substrate 10 in a flip-chip manner. Dams 13, which are formed on the edges of the substrate 10, may be used to precisely aligning the semiconductor chip 30 over the substrate 10.

In order to perform the desired alignment, the inside space surrounded by the dams 13 may be defined to have a size greater than or equal to that of the semiconductor chip 30. The alignment may be quickly performed when the respective dams 13 are disposed to be separated from the edges of the semiconductor chip 30 by a distance greater than or equal to 5 μm.

Figure 7:
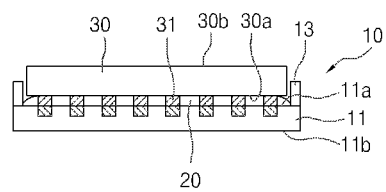

Thereafter, by performing a reflow process, the viscosity of the underfill member 20 may decrease, and the underfill member 20 may be discharged through the gaps 13a which are defined between adjacent dams 13. Thus, as referred to in FIG. 7, bumps 31 of the semiconductor chip 30 may be connected to the bump lands 12.

Further, by applying heat and pressure, the bumps 31 of the semiconductor chip 30 may be secured to the bump lands 12 of the substrate 10, by which the semiconductor chip 30 is effectively bonded to the substrate 10.

Figure 8:
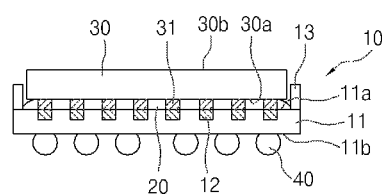

Finally, referring to FIG. 8, external connection terminals 40 such as solder balls or bumps may be formed on the second surface 11b of the substrate 10, completing the manufacture of the semiconductor package.

Therefore, since it is not necessary to precisely align a semiconductor chip on a substrate, it is possible to quickly bond the semiconductor chip to the substrate, thereby shortening a manufacturing time.

While the method for manufacturing the semiconductor package was described by referring to the substrate of FIG. 1 in which gaps may be defined between adjacent dams, it is to be noted that the present invention is not limited to such, and the substrate of FIG. 2 defined with slits and the substrate of FIG. 3 defined with discharge holes may be applied to replace the substrate of FIG. 1 defined with gaps.

Figure 9:
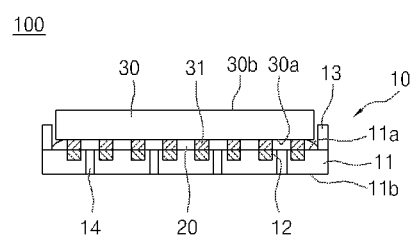
FIG. 9 is a cross-sectional view illustrating a semiconductor package in accordance with another embodiment of the present invention.

Referring to FIG. 9, a semiconductor package 100 according to an embodiment of the present invention may include a substrate 10 and a semiconductor chip 30.

The substrate 10 may include a substrate body 11 and dams 13. The substrate body 11 may have a first surface 11a and a second surface 11b which faces away from the first surface 11a. A plurality of bump lands 12 may be formed on the first surface 11a to be connected with bumps 31 of the semiconductor chip 30 which are to be mounted onto the first surface 11a. The substrate body 11 may have discharge openings 14 which penetrate the first surface 11a and the second surface 11b in such a way as not to interfere with the bump lands 12. The discharge openings 14 may prevent overflow of an underfill member 20 which is introduced when bonding the semiconductor chip 30 to the substrate 10.

The dams 13 may be formed on the edges of the substrate body 11 in such a way as to project upward. At least one dam 13 may be disposed in each of a transverse direction and a longitudinal direction, on the substrate body 11 which may have a rectangular shape. A gap (see the reference numeral 13a of FIG. 1) or a slit (see the reference numeral 13b of FIG. 2) may be defined between adjacent dams 13 to serve as discharge units of the underfill member 20 in cooperation with the discharge openings 14. Alternatively, discharge holes (see the reference numeral 13c of FIG. 3) may be defined not between dams 13 but through the dams 13.

The semiconductor chip 30 may have a third surface 30a which faces the first surface 11a of the substrate body 11 and a fourth surface 30b which faces away from the third surface 30a, and may include therein memories, logic components, passive devices, etc. One or more bonding pads (not shown) may be formed on the third surface 30a of the semiconductor chip 30 to electrically connect the semiconductor chip 30 with the substrate 10, and the bumps 31 may be formed on the respective bonding pads.

The underfill member 20 may fill the space between the substrate 10 and the semiconductor chip 30. The underfill member 20 may comprise of an NCF (non-conductive film) or an NCP (non-conductive paste) with a predetermined viscosity.

Figure 10:
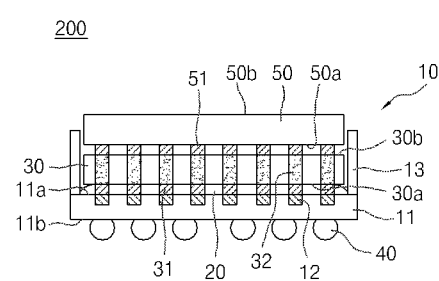
FIG. 10 is a cross-sectional view illustrating a stack package in accordance with another embodiment of the present invention.

Referring to FIG. 10, a stack package 200 according to an embodiment of the present invention may include a substrate 10, and one or more semiconductor chips 30 and 50 stacked on the substrate 10. While a stack package in which two semiconductor chips are stacked on a substrate is shown in FIG. 10, it is to be noted that the present invention is not limited to such, as three or more semiconductor chips may be stacked.

The substrate 10 may include a substrate body 11 and dams 13.

The substrate body 11 may have a first surface 11a and a second surface 11b which faces away from the first surface 11a. A plurality of bump lands 12 may be formed on the first surface 11a to be connected with bumps 31 of the semiconductor chip 30 which are to be mounted onto the first surface 11a.

The dams 13 may be formed on the edges of the first surface 11a of the substrate body 11 in such a way as to project upward. At least one dam 13 may be disposed in each of a transverse direction and a longitudinal direction on the substrate body 11 which may have a rectangular shape. A gap (see the reference numeral 13a of FIG. 1) or a slit (see the reference numeral 13b of FIG. 2) may be defined between adjacent dams 13. Alternatively, discharge holes (see the reference numeral 13c of FIG. 3) may be defined not between dams 13 but through the dams 13, to prevent overflow of an underfill member 20 which is introduced when bonding the semiconductor chip 30 to the substrate 10.

In an embodiment of the present invention, the semiconductor chips 30 and 50 may include a first semiconductor chip 30 and a second semiconductor chip 50.

The first semiconductor chip 30 may have a third surface 30a which faces the first surface 11a of the substrate body 11 and a fourth surface 30b which faces away from the third surface 30a, and may include therein memories, logic components, passive devices, etc. The first semiconductor chip 30 may include through electrodes 32 which electrically connect the third surface 30a and the fourth surface 30b. The through electrodes 32 may serve as internal connection terminals, and may comprise of a conductive substance such as copper. One or more bonding pads (not shown) may be formed on the third surface 30a of the first semiconductor chip 30 to electrically connect the first semiconductor chip 30 with the substrate 10, and the bumps 31 may be formed on the respective bonding pads to be connected with the through electrodes 32.

The second semiconductor chip 50 may have a fifth surface 50a which faces the fourth surface 30b of the first semiconductor chip 30 and a sixth surface 50b which faces away from the fifth surface 50a, and may be bonded to the fourth surface 30b of the first semiconductor chip 30. The second semiconductor chip 50 may include therein memories, logic components, passive devices, etc. One or more bonding pads may be formed on the fifth surface 50a of the second semiconductor chip 50, and bumps 51 may be formed on the respective bonding pads. The bumps 51 may be formed at positions corresponding to the through electrodes 32 of the first semiconductor chip 30.

In order to perform the desired alignment of the semiconductor chip 30 bonded to the substrate 10, the dams 13 may have a height that is less than the height of the sixth surface 50b of the second semiconductor chip 50 and is greater than the vertical space between the second semiconductor chip 50 and the substrate 10.

The above-described semiconductor package technology may be applied to various kinds of semiconductor devices and package modules having the same.

Figure 11:
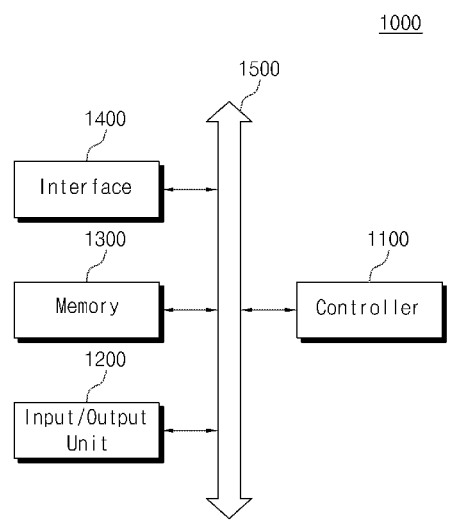
FIG. 11 is a system block diagram of an electronic apparatus to which the semiconductor package according to the present invention is applied.

Referring to FIG. 11, the semiconductor package in accordance with an embodiment of the present invention may be applied to an electronic system 1000. An electronic system 1000 may include a controller 1100, an input/output unit 1200, and a memory 1300, which may all be coupled with one another through a bus 1500 providing a path through which data move.

For example, the controller 1100 may include at least any one of a microprocessor, a digital signal processor, a microcontroller, or logic devices capable of performing the similar or same functions as these components. The controller 1100 and the memory 1300 may include at least any one of the semiconductor packages according to the various embodiments of the present invention. The input/output unit 1200 may include at least a keypad, a keyboard, a display device, and so forth. The memory 1300 may be a device for storing data, and may store data and/or commands to be executed by the controller 1100, and the likes.

The memory 1300 may include a volatile memory device such as a DRAM and/or a nonvolatile memory device such as a flash memory. For example, a flash memory may be mounted to an information processing system such as a mobile terminal or a desk top computer. The flash memory may be constituted by a semiconductor disc device (SSD). The electronic system 1000 may stably store a large amount of data in a flash memory system.

The electronic system 1000 may further include an interface 1400 configured to transmit and receive data to and from a communication network. The interface 1400 may be of a wired or wireless type. For example, the interface 1400 may include an antenna or a wired or wireless transceiver. Further, the electronic system 1000 may be additionally provided with an application chipset, an input/output unit, etc.

The electronic system 1000 may be realized as a mobile system, a personal computer, an industrial computer or a logic system performing various functions. For example, the mobile system may be any one of a personal digital assistant (PDA), a portable computer, a web tablet, a mobile phone, a smart phone, a wireless phone, a laptop computer, a memory card, a digital music system, and an information transmission/reception system.

In The electronic system 1000 may be used in a communication system such as of CDMA (code division multiple access), GSM (global system for mobile communication), NADC (north American digital cellular), E-TDMA (enhanced-time division multiple access), WCDAM (wideband code division multiple access), CDMA2000, LTE (long term evolution) and Wibro (wireless broadband Internet).

Figure 12:
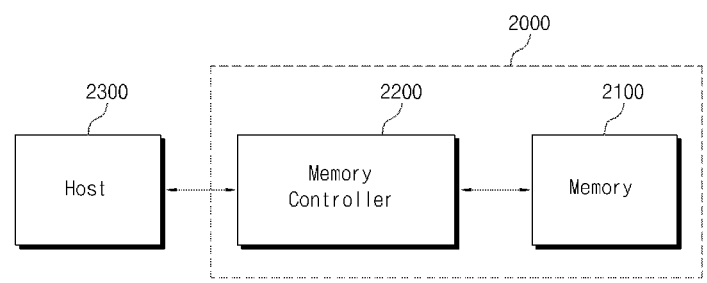
FIG. 12 is a block diagram showing an example of an electronic apparatus which includes the semiconductor package according to the present invention.

Referring to FIG. 12, the semiconductor package in accordance with an embodiment of the present invention may be provided in the form of a memory card 2000. For example, the memory card 2000 may include a memory 2100 such as a nonvolatile memory device and a memory controller 2200. The memory 2100 and the memory controller 2200 may store data or read stored data.

The memory 2100 may include at least any one among nonvolatile memory devices to which the semiconductor package technology of the various embodiments of the present invention is applied. The memory controller 2200 may control the memory 2100 such that stored data is read out or data is stored in response to a read/write request from a host 2300.

Although specific embodiments of the present invention have been described for illustrative purposes, those skilled in the art will appreciate that various modifications, additions and substitutions are possible, without departing from the scope and the spirit of the invention as disclosed in the accompanying claims.

What is claimed is:
1. A substrate for a semiconductor package, comprising:
   a substrate body having a first surface and a second surface which faces away from the first surface, and formed with at least one bump land on the first surface; and a dam formed on the first surface of the substrate body and projected over an edge of the first surface of the substrate body, and the dam having an underfill member discharge unit, wherein the at least one bump land is in direct contact with the first surface of the substrate body and the at least one bump land is located within the first surface of the substrate body, and wherein the underfill member discharge unit is configured to prevent an underfill member from overflowing over the dam.

2. The substrate according to claim 1, wherein the dam comprises a plurality of dams, and the underfill member discharge unit comprises a plurality of gaps each of which is defined between two adjacent dams.

3. The substrate according to claim 1, wherein the dam comprises a plurality of dams, and the underfill member discharge unit comprises a slit which is defined between two adjacent dams.

4. The substrate according to claim 1, wherein the dam comprises a plurality of dams, and the underfill member discharge unit comprises a discharge hole which is defined to penetrate a portion of the dam.

5. A semiconductor package comprising:
a substrate including a substrate body having a first surface and a second surface which faces away from the first surface, and formed with at least one bump land on the first surface, and a dam formed on the first surface of the substrate body and projected over an edge of the first surface of the substrate body, and the dam having an underfill member discharge unit; and
a first semiconductor chip having a third surface which faces the first surface and a fourth surface which faces away from the third surface, the third surface formed with a bump corresponding to the bump land on the first surface, and bonded to the substrate,
wherein the at least one bump land is in direct contact with the first surface of the substrate body and the at least one bump land is located within the first surface of the substrate body, and
wherein the underfill member discharge unit is configured to prevent an underfill member from overflowing over the dam.

6. The semiconductor package according to claim 5, wherein the dam comprises a plurality of dams, and the underfill member discharge unit comprises any one of a plurality of gaps each of which is defined between two adjacent dams or a slit which is defined between two adjacent dams.

7. The semiconductor package according to claim 5, wherein the dam comprises a plurality of dams, and the underfill member discharge unit comprises a discharge hole which is defined to penetrate a portion of the dam.

8. The semiconductor package according to claim 5, wherein the dam has a height that is less than a height of the fourth surface and greater than a vertical space between the third surface and the second surface.

9. The semiconductor package according to claim 5, wherein an inside space surrounded by the dam has a size greater than or equal to that of the first semiconductor chip.

10. The semiconductor package according to claim 5, further comprising:
an underfill member interposed between the substrate and the first semiconductor chip.

11. A semiconductor package comprising:
a substrate including a substrate body which has a first surface and a second surface facing away from the first surface, is formed with one or more bump lands on the first surface and is defined with a discharge opening penetrating the first surface and the second surface, and a dam which is formed on the first surface of the substrate body and projected over an edge of the first surface of the substrate body; and
a semiconductor chip having a third surface which faces the first surface and a fourth surface which faces away from the third surface, the third surface formed with bumps corresponding to the bump lands on the first surface, and bonded to the substrate,
wherein the dam includes an underfill member discharge unit,
wherein the at least one bump land is in direct contact with the first surface of the substrate body and the at least one bump land is located within the first surface of the substrate body, and
wherein the underfill member discharge unit is configured to prevent an underfill member from overflowing over the dam.

12. The semiconductor package according to claim 11, wherein the dam has a height that is less than a height of the fourth surface and greater than a vertical space between the third surface and the substrate.

13. The semiconductor package according to claim 11, further comprising:
an underfill member interposed between the substrate and the semiconductor chip.

14. The semiconductor package according to claim 11, wherein an inside space surrounded by the dam has a size greater than or equal to that of the semiconductor chip.

15. A semiconductor package comprising:
a substrate including a substrate body which has a first surface and a second surface facing away from the first surface, is formed with one or more bump lands on the first surface, and a dam which is formed on the first surface of the substrate body and projecting over a perimeter of the first surface of the substrate body; and
a semiconductor chip having a third surface facing the first surface and a fourth surface facing away from the third surface, the third surface located closer to the first surface than the fourth surface, the third surface formed with bumps corresponding to the bump lands on the first surface, and bonded to the substrate,
wherein the dam includes an underfill member discharge unit, and
wherein the underfill member discharge unit is defined by the dam and is configured to prevent an underfill member from overflowing over the dam.

16. The semiconductor package according to claim 15, wherein the dam forms the perimeter and the semiconductor chip is located over the substrate and within the perimeter formed by the dam.

17. The semiconductor package according to claim 15, wherein the dam extends from the perimeter of the first surface and the one or more bump lands are located within the perimeter of the first surface.

18. The semiconductor package according to claim 17, wherein the one or more bump lands are formed within the first surface of the substrate.

* * * * *